United States Patent
Gervais et al.

(10) Patent No.: US 9,743,117 B2
(45) Date of Patent: Aug. 22, 2017

(54) METHOD FOR ENCODING, COMPRESSED IMAGES IN PARTICULAR, IN PARTICULAR BY "RANGE CODER" OR ARITHMETIC COMPRESSION

(71) Applicant: Jean-Claude Colin, Versailles (FR)

(72) Inventors: Than Marc-Eric Gervais, Paris (FR); Bruno Loubet, Paris (FR); Nicolas Bessou, Sartrouville (FR); Yves Guimiot, Conflans Sainte Hororine (FR); Mickael Petit Fils, Livry-Gargan (FR); Sebastien Roques, Paris (FR)

(73) Assignee: Jean-Claude Colin, Versailles (FR)

( * ) Notice: Subject to any disclaimer, the term of this patent is extended or adjusted under 35 U.S.C. 154(b) by 0 days.

(21) Appl. No.: 14/888,710

(22) PCT Filed: May 14, 2014

(86) PCT No.: PCT/FR2014/000106
§ 371 (c)(1),
(2) Date: Nov. 3, 2015

(87) PCT Pub. No.: WO2014/184452
PCT Pub. Date: Nov. 20, 2014

(65) Prior Publication Data
US 2016/0073136 A1    Mar. 10, 2016

(30) Foreign Application Priority Data

May 17, 2013   (FR) ...................................... 13 54479

(51) Int. Cl.
*G06K 9/36* (2006.01)
*H04N 19/91* (2014.01)
(Continued)

(52) U.S. Cl.
CPC .......... *H04N 19/91* (2014.11); *H03M 7/4006* (2013.01); *H04N 19/44* (2014.11);
(Continued)

(58) Field of Classification Search
None
See application file for complete search history.

(56) References Cited

U.S. PATENT DOCUMENTS 5,748,786 A * 5/1998 Zandi .................... G06F 17/148
                                                375/E7.016
5,867,602 A * 2/1999 Zandi .................... G06F 17/148
                                                375/E7.016
(Continued)

OTHER PUBLICATIONS

Carrillo et al, Sparsity Averaging Reweighted Analysis (SARA): a novel algorithm for radio-interferometric imaging, Mon. Not. R. Astron. Soc. 426, 1223-1234 (2012).*
(Continued)

*Primary Examiner* — Andrae S Allison
(74) *Attorney, Agent, or Firm* — Young & Thompson

(57) ABSTRACT

A method for encoding a series of symbols using several models of the arithmetic or range coder type and including steps where each model is associated with a belonging criterion, the series is run through in order to determine, for each symbol, the encoding model to which each symbol belongs, according to the criteria; then a probability of occurrence of each symbol in the corresponding model is determined; then the series is run through by encoding each symbol successively; and a file is formed from the code thus obtained.

20 Claims, 4 Drawing Sheets

(51) Int. Cl.
    *H03M 7/40*     (2006.01)
    *H04N 19/44*     (2014.01)
    *H04N 19/48*     (2014.01)
    *H04N 19/63*     (2014.01)
    *H04N 19/93*     (2014.01)

(52) U.S. Cl.
    CPC ............ *H04N 19/48* (2014.11); *H04N 19/63* (2014.11); *H04N 19/93* (2014.11)

(56) References Cited

U.S. PATENT DOCUMENTS

| | | | | |
|---|---|---|---|---|
| 5,881,176 A * | 3/1999 | Keith | ............... | G06F 17/148 375/E7.016 |
| 6,141,446 A * | 10/2000 | Boliek | ............... | H03M 7/30 375/240.11 |
| 6,163,626 A * | 12/2000 | Andrew | ............... | H04N 19/63 375/E7.046 |
| 6,229,927 B1 * | 5/2001 | Schwartz | ............... | G06F 17/148 375/E7.016 |
| 6,549,666 B1 * | 4/2003 | Schwartz | ............... | G06F 17/148 375/E7.016 |
| 7,050,640 B1 * | 5/2006 | Acharya | ............... | H04N 19/647 375/E7.047 |
| 2002/0048405 A1 * | 4/2002 | Zandi | ............... | G06F 17/148 382/232 |
| 2003/0108247 A1 * | 6/2003 | Acharya | ............... | H04N 19/647 382/240 |
| 2003/0118241 A1 * | 6/2003 | Zandi | ............... | G06F 17/148 382/240 |
| 2011/0116542 A1 * | 5/2011 | Oger | ............... | G10L 19/00 375/240.03 |
| 2013/0027230 A1 | 1/2013 | Marpe et al. | | |

OTHER PUBLICATIONS

F. Luthon, M. Lievin and F. Faux, "On the use of entropy power for threshold selection." Int. J. Signal Proc., 84, 2004, pp. 1789-1804.*

Detlev, Marpe, H. Schwarz, and G. Blaettermann. "Context-Based Adaptive Binary Arithmetic Coding in JVT/H. 26L." Proc. IEEE International Conference on Image Processing (ICIP'02). vol. 2. 2002.*

Pearlman et al., "Image Wavelet Coding Systems: Part II of Set Partition Coding and Image Wavelet Coding Systems," Foundations and Trends in Signal Processing, vol. 2, No. 3 (2008), pp. 181-246.

Shapiro, "Embedded Image Coding Using Zerotrees of Wavelet Coefficients," IEEE Transactions on Signal Processing, vol. 41, No. 12, Dec. 1993, pp. 3445-3462.

Yu et al., "Novel Coding Scheme for Wavelet Image Compression," Record of the Thirty-Fourth Asilomar Conference on Signals, Systems and Computers, Oct. 29-Nov. 1, 2000.

* cited by examiner

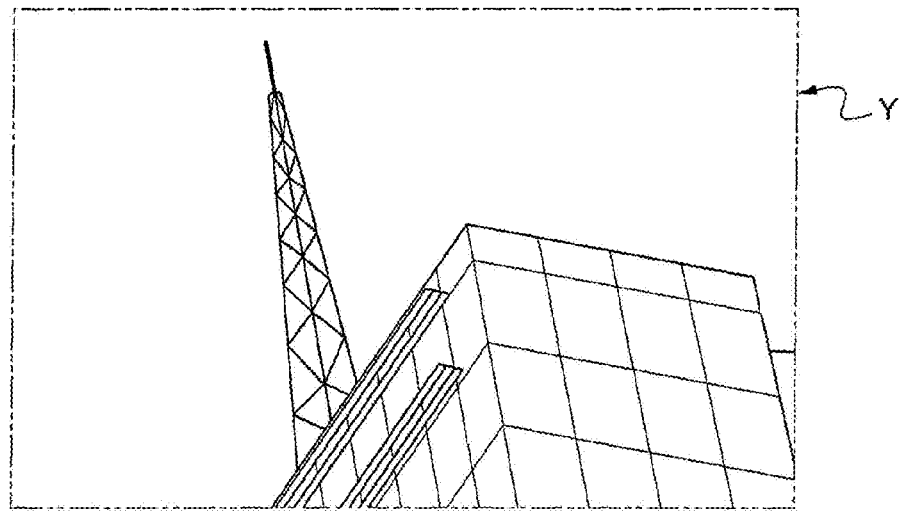

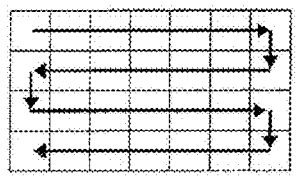
Fig.3
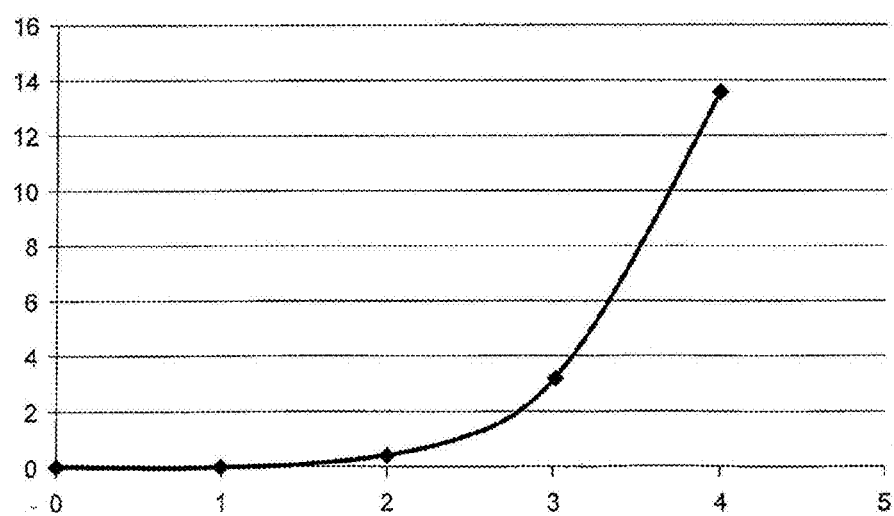
Fig.4
| Model No (ω) | Lower bound l(ω) |
|---|---|
| 0 | 0 |
| 1 | 0.013023495 |
| 2 | 0.422101064 |
| 3 | 3.229332781 |
| 4 | 13.68060622 |
Tab1
Fig.5

Tab3

Fig.8

| Value | Model 0 | Model 1 | Model 2 | Model 3 | Model 4 |
|---|---|---|---|---|---|
| Number | 795 | 94 | 149 | 151 | 11 |
| -42 |  |  | 1 |  |  |
| -41 |  |  |  |  |  |
| -40 |  |  |  |  |  |
| -39 |  |  |  |  |  |
| -38 |  |  |  |  |  |
| -37 |  |  |  |  |  |
| -36 |  |  |  |  |  |
| -35 |  |  |  |  |  |
| -34 |  |  |  |  |  |
| -33 |  |  |  |  |  |
| -32 |  |  |  |  |  |
| -31 |  |  |  |  |  |
| -30 |  |  |  |  |  |
| -29 |  |  |  |  |  |
| -28 |  |  |  |  |  |
| -27 |  |  |  |  |  |
| -26 |  |  |  |  |  |
| -25 |  |  |  | 2 |  |
| -24 |  |  |  | 1 |  |
| -23 |  |  |  |  |  |
| -22 |  |  |  | 3 |  |
| -21 |  |  |  |  |  |
| -20 |  |  |  | 1 |  |
| -19 |  |  |  | 1 |  |
| -18 | 1 |  |  | 1 |  |
| -17 |  |  | 1 |  |  |
| -16 |  |  | 1 |  |  |
| -15 |  |  | 1 | 1 | 1 |
| -14 |  | 1 |  | 3 |  |
| -13 |  |  |  |  |  |
| -12 |  |  | 2 | 2 |  |
| -11 |  |  | 3 | 2 | 1 |
| -10 |  |  |  |  |  |
| -9 |  | 1 | 2 | 5 |  |
| -8 |  | 1 | 2 | 3 |  |
| -7 |  |  | 7 | 3 |  |
| -6 |  |  | 6 | 1 |  |
| -5 |  |  | 5 |  |  |
| -4 |  |  | 4 | 5 |  |
| -3 |  |  | 3 | 5 |  |
| -2 |  | 1 | 2 | 4 |  |
| -1 | 15 | 3 | 1 | 8 | 3 |
| 0 | 759 | 81 | 61 | 59 | 1 |
| 1 | 10 | 3 | 17 | 4 |  |
| 2 | 1 |  | 9 | 5 | 1 |
| 3 | 1 | 2 | 7 | 6 |  |
| 4 | 1 |  | 2 | 4 | 1 |
| 5 | 3 |  | 2 | 5 | 1 |
| 6 |  |  | 5 | 6 |  |
| 7 | 2 |  | 2 | 7 |  |
| 8 |  |  | 3 | 1 |  |
| 9 |  |  |  | 1 |  |
| 10 |  | 1 | 1 | 3 | 1 |
| 11 | 1 |  | 1 |  |  |
| 12 |  |  |  | 1 |  |
| 13 |  |  | 1 | 2 |  |
| 14 |  |  |  |  |  |
| 15 |  |  |  | 1 |  |
| 16 |  |  |  |  | 1 |
| 17 |  |  |  | 3 |  |
| 18 |  |  |  | 1 |  |
| 19 |  |  |  | 1 |  |
| 20 |  |  |  | 1 |  |
| 21 |  |  | 1 |  |  |
| 22 |  |  |  |  |  |
| 23 |  |  |  | 1 |  |
| 24 |  |  |  |  |  |
| 25 |  |  |  |  |  |
| 26 |  |  |  |  |  |
| 27 |  |  |  |  |  |
| 28 |  |  |  |  |  |
| 29 |  |  |  |  |  |
| 30 |  |  |  |  |  |
| 31 |  |  |  |  |  |
| 32 |  |  |  |  |  |
| 33 |  |  |  |  |  |
| 34 |  |  |  |  |  |
| 35 |  |  |  | 1 |  |

METHOD FOR ENCODING, COMPRESSED IMAGES IN PARTICULAR, IN PARTICULAR BY "RANGE CODER" OR ARITHMETIC COMPRESSION

The present invention relates mainly to the field of entropic binary encoding, in particular encoding using encoding models of the "range coder" type, that is to say using ranges, or of the arithmetic type.

Encoders of the range coder or arithmetic type make it possible to encode a series of symbols without loss. These symbols may be of any type, in particular alphanumeric characters or punctuation characters. In the case of methods for compressing an image, the symbols are numbers resulting from the prior compression of said image, for example by a differential compression or a wavelet compression generally preceded by calorimetric transformation.

A so-called entropic binary encoding makes it possible to reduce the number of bits necessary for encoding a signal, here represented by the series of symbols to be encoded, without loss on the content thereof. The level of reduction depends on the probability of occurrence of the symbols in the signal. In particular, so-called "arithmetic" and "range coder" encodings use probability models in which each symbol is associated with a probability. The theoretic number of bits necessary for encoding the symbol is, in the context of an encoder of the "range coder" or arithmetic coding type, $-\log 2(P)$, where P is the probability of occurrence of this symbol in the signal.

An encoder of the range coder or arithmetic coder type must always have, during the encoding or decoding of a symbol, a probability model comprising one or more symbols, as well as the probability of occurrence thereof, including at least the current symbol. The probability of the symbol is used to encode it. To encode the same signal, several probability models are possible. The most suitable is the model for which the signal is the most compressed, that is to say for which the code resulting from the encoding has the lowest weight.

For a binary coding to be efficient, it is necessary for:
the decoded data to be identical to the input data;
the weight of the compressed data to be as small as possible;
the encoding time to be as short as possible;
the decoding time to be as short as possible.
This depends on two main factors:
the encoding in itself, which must, for a given probability P, encode the symbol on a number of bits as close as possible to $-\log 2(P)$, while restoring the same symbol on decoding if the same model is supplied to it;
the computation of the models, which must make it possible to supply the model most suited to each of the symbols, while being as quick as possible.

It is thus possible to use one model for the entire signal. Then a compression level close to Shannon entropy is obtained. On the other hand, some encoders use completely adaptive models, such as the PPMd method, from the English "Prediction by Partial Matching, escape method D". In this case, the models are established as the encoding progresses. These encoders make it possible to obtain multiple models, suitable for each symbol, but the processing periods are much longer.

The aim of the invention is to propose an encoding method that makes it possible to obtain a code the weight of which is lower than that generally obtained by means of a single model, and where the processing periods are shorter than those generally obtained with multiple models.

In the context of multimedia compression, it is found that, after transformation of the signal, for example by so-called wavelet methods, the low values are generally close to one another, just as the highest values are closer to one another.

According to the invention, such an entropic binary coding method for a series of symbols using at least two models, each model being associated with a belonging criterion, comprising steps during which:
said series is run through in order, for each symbol, to determine the encoding model to which it belongs, according to said belonging criteria; then
for each model and for each symbol, a probability of occurrence of the symbol in the model is determined; then
said series is run through once again by encoding each symbol successively according to the model to which it belongs; and
the models or information enabling them to be reconstituted and the binary code thus obtained are stored.

Advantageously, the series is run through in advance in order to determine the criteria of belonging to each of the models.

Preferably, the belonging of a current symbol to a model is determined according to a belonging function calculated from one or more symbols preceding said current symbol in the series. Each symbol being able to be a number, preferably a number in base 10, the belonging function may be the mean of the absolute values of a given number of reference symbols, preferably four reference symbols, immediately preceding said current symbol in the series.

For calculating the belonging function the list is advantageously preceded by a sufficient number of arbitrary symbols, the value of each preferably being zero.

The criterion of belonging to one of the models may be a lower bound for a range covered by the model and the comparison of the mean of the preceding symbols with said bound. The bounds of each of the models being stored in an increasing order, the difference between two successive bounds advantageously increases when the value of said bounds increases. To determine the bound of each model it is possible to:
calculate the mean of the values of the symbols in the series; then
calculate the value of the difference between the maximum value and the mean on one hand and the mean and the minimum value on the other hand among the values of symbols in the series, and to deduce therefrom a distance equal to the maximum from these two; then
calculate a deviation equal to the mean of the absolute values of the differences between each element of the signal and the mean of the series; then
calculate a spacing according to the formula:

$$\text{Spacing} = \frac{\ln\left(\frac{\text{Distance}}{\text{Deviation}}\right)}{\ln(2)}$$

then
calculate the bound between the moving averages each of the successive models in accordance with the following formula:

$$l(m) = \text{Distance} * \left(\frac{(m)}{\text{number of models}}\right)^{\text{spacing}}$$

The invention also relates to a method for compressing a medium of the image, video or sound type, characterised in that it uses an encoding method according to the invention. A method for compressing an image applies preferentially to compressed symbols of the image, each corresponding to a box in a matrix, the series being formed by putting said symbols in a line. For putting the symbols in a line, for each row it is possible to run through a row in a first direction and then the following row, if applicable, in the opposite direction to the first.

According to another subject matter of the invention, an entropic binary decoding method for a series of symbols using at least two models and encoded by means of a method according to the invention is characterised in that:
each of the models used on encoding is extracted;
the criteria for belonging to each of these models are extracted and recalculated, and
the same belonging criteria are used as on encoding for decoding each symbol by means of the model used on encoding.

Several embodiments of the invention will be described below, by way of non-limitative examples, with reference to the accompanying drawings, in which:

FIG. 1 illustrates a layer of an image to which a method according to the invention is applied;

FIG. 2 illustrates a sub-matrix, referred to as level-3 LH, of coefficients, in base 10, resulting from a wavelet transformation of the image of FIG. 1 followed by quantisation and rounding;

FIG. 3 illustrates the method for putting the coefficients of the matrix of FIG. 2 in a line, so as to form a series of symbols to be processed by the method according to the invention;

FIG. 4 illustrates a table giving, for each model used, the value of a corresponding lower bound;

FIG. 5 is graphical representation of the table in FIG. 4;

FIG. 8 is a table showing, for each value, its number of occurrences in each of the models.

Figure 6:
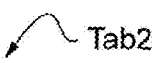
FIG. 6 is a table showing all the values in base 10 corresponding to the symbols of the series and, for each value, its number of occurrences in the series and therefore its probability in the context of a single model.

To illustrate an example of a method according to the invention, an original image is used, the pixels of which are disposed in 320 columns and 240 rows and encoded with three components R (red), G (green) and B (blue). This image then underwent a colorimetric transformation of the Y, Cb, Cr type. FIG. 1 illustrates, in the form of an image, the Y luminance component resulting from the colorimetric transformation.

A two-dimensional CDF 5/3 wavelet transformation using fixed-point numbers is first of all applied to the image 1. FIG. 2 illustrates a matrix LHQ corresponding to a so-called level-3 LH sub-matrix resulting from this wavelet transformation to which a quantisation by means of a coefficient equal to 3.53 was next applied, and then rounding to the closest integer. This wavelet transformation is effected for each level in two dimensions: a vertical pass and then a horizontal pass. The vertical wavelet transformation generates a so-called detail matrix, or H matrix, and a so-called approximation matrix, or L matrix. The application of a horizontal wavelet pass to the L matrix generates an LH detail matrix and a LL approximation matrix. The application of a vertical wavelet pass to the H matrix generates two detail matrices HL and HH. New wavelet levels are then applied recursively to successive approximation matrices LL. Thus the level-3 LH matrix is the type-LH matrix obtained during the third level of wavelets. Once the LH matrix is obtained, it is quantised by a factor 3.53 and then its values are rounded in order to obtain the LHQ matrix.

The LHQ matrix comprises 40 columns and 30 rows, that is to say 1200 values each corresponding to a symbol to be encoded. To apply the processing according to the invention, the 1200 values are put in a line, that is to say a series S of the 1200 values is formed. In the example illustrated, the putting in a line is done as illustrated in FIG. 3, the first row of the LHQ matrix being run through from left to right, then the second from right to left, so that, in a series S, the last value of the first row of the LHQ matrix precedes the last value of the second row. More generally, a row being run through in one direction, the following row is run through in the opposite direction. In this way a signal formed by the series of symbols Sn is obtained, n integer varying from 1 to N, with N=1200, each symbol Sn having a value denoted V(n).

In the example illustrated, in order to determine the models to be applied to the signal S, an analysis of this signal is first of all made.

First of all an arithmetic mean M of all the values of the signal are computed, in accordance with the formula:

$$m = \frac{\sum_{r=L}^{r=N} V(n)}{N} = -0.07833$$

The minimum value Min[V(n)] and the maximum value Max[V(n)] are then determined, that is to say, in the example illustrated:

Min[$V(n)$]=−42

Max[$V(n)$]=35

A distance D is deduced from this, where D is equal to a maximum from the value of the difference between the mean M and the minimum value of the signal Min[V(n)] on the one hand and the value of the difference between the maximum value of the signal Max[V(n)] and the mean M on the other hand; that is to say:

$$D = \text{Distance}$$
$$= \max(\text{Mean} - \text{Minimum}, \text{Maximum} - \text{Mean})$$
$$= \max((-0.07833) - (-42); 35 - 0.07833)$$
$$= 41.9216$$

Next a deviation DV is calculated, that is to say a mean dispersion, of the value around the mean M. This dispersion is calculated as the mean of the absolute values of the differences between the values V(n) of each symbol Sn of the signal and the mean M; that is to say, in the example illustrated:

$$DV = \text{deviation} = \frac{\sum_{n=z}^{n=N} \text{abs}(V(n) - \text{Mean})}{N} = 1.2934$$

Next a spacing E between the models is calculated. In the example illustrated, this spacing is calculated in accordance with the formula:

$$E = \text{spacing} = \frac{\ln\left(\frac{\text{Distance}}{\text{Deviation}}\right)}{\ln(2)} = \frac{\ln\left(\frac{41.9216}{1.2934}\right)}{\ln(2)} = 5.0183$$

Advantageously, the wider the signal to be coded, the larger the number of models. It is an input parameter that can depend on the quantity of information present in the signal. In the example illustrated, it has been chosen to use five models.

For each model numbered from 0 to 4, a lower bound is defined as from which the symbol can belong to this model. Preferably, the smaller the variations relating to the model, the closer the thresholds to each other. In this way the following formula is defined to calculate, in the context of the example, the lower bounds of each model:

$$l(m) = \text{distance} * \left(\frac{m}{\text{Number of models}}\right) \text{spacing}$$

Where m is the number of one model among the 5, m taking the integer values 0 to 4.

The lower values thus calculated are listed in the table Tab1, depicted in FIG. 4 and illustrated on the graph in FIG. 5.

In order to associate each symbol Sn with a model, it is necessary to define a belonging criterion that can be compared with the previously calculated bounds l(m). Furthermore, it is necessary for this criterion to be identical on encoding and decoding, so that the same model is applied to the same symbol, so that the restored value of this symbol during decoding is the same as its initial value. For this purpose, the belonging criterion is chosen as a function of values of symbols preceding the current symbol, that is to say the one to be encoded or decoded.

The encoding and decoding taking place without loss, the values preceding the current symbol will be identical on compression and decompression. Thus applying the same belonging criterion to these same values on encoding and on decoding will allocate the same model to the current symbol.

In the example illustrated, the values after wavelets are assumed to be centred or almost centred on zero. This is because the mean M is substantially equal to zero. Because of this, the function determining the belonging criterion chosen is a mean of the absolute values of the four symbols immediately preceding the current symbol, rounded to four decimals. The number of preceding symbols used may be different, but sufficient to limit the influence of a value that deviated excessively from the others, which would give rise to an unwanted change in model, and advantageously a power of 2, to facilitate its binary notation. The number of decimals may also be different from 4, but advantageously a power of 2, to facilitate its binary notation.

The criterion of belonging to a model, in the example illustrated, is therefore determined by the formula:

$$mm(n) = \sum_{nn=1}^{n'=\text{size of moving average}} \frac{\text{abs}(V(n-n'))}{\text{size of moving average}}$$

where the size of the moving average T is equal to 4, that is to say the number of preceding symbols taken into account for calculation thereof, n' varying from 1 to 4.

This makes it possible to select a suitable model for each symbol Sn. The moving average mm(n) is calculated with a given precision in a parameter, here four decimals, that is identical on encoding and decoding.

Each symbol Sn of value V(n) belongs to the largest model m the lower bound l(m) of which is less than or equal to the moving average of the preceding absolute values mm(n): l(m)≤mm(n).

Figure 7:
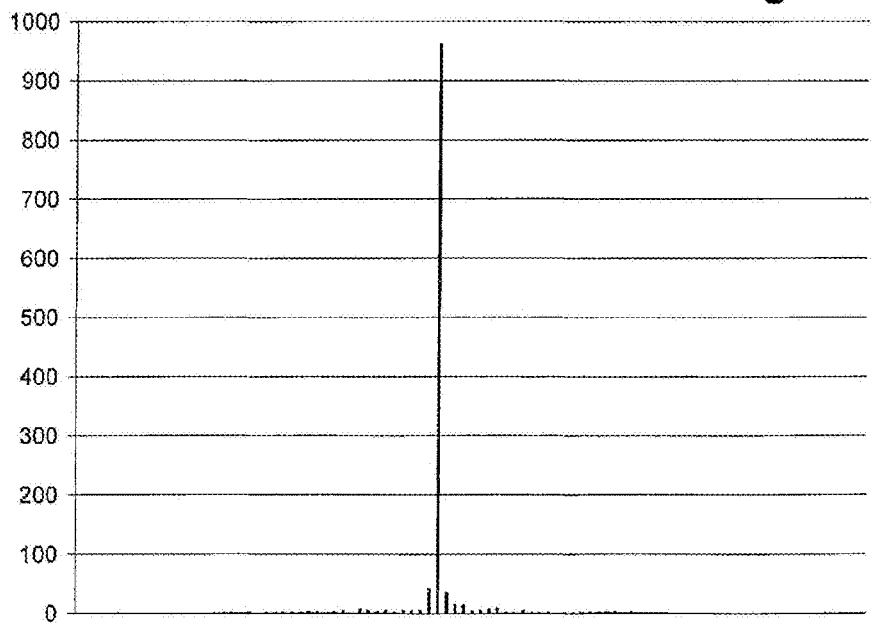
FIG. 7 is a graphical representation of the table in FIG. 6.

The table Tab2, illustrated in FIG. 6, presents the number of occurrences of each value V(n) in the signal S. FIG. 7 is the graphical representation thereof. It will be noted that the zero value is over represented therein. The use of a single model would therefore be particularly unsuitable.

The table Tab3, illustrated in FIG. 8, presents the number of occurrences of each value V(n) in each model M.

At the end of the selection of a model m for each symbol Sn, an encoder of the "range coder" or arithmetic type is applied to the values of this model. For this purpose the number of occurrences of each symbol Sn in this model m is first of all calculated and a probability of appearance of this symbol in this model m is deduced therefrom.

For encoding, the signal is run through in the direction of increasing indices n, as defined previously with reference to FIG. 3. For each symbol, the model to which it belongs is determined, in accordance with the belonging criterion defined previously. Next this model is used in the chosen encoder, for example an encoder of the "range coder" or arithmetic type. For each model it is also possible to choose an encoder of a type different from that chosen for another model.

The first symbols to be encoded being preceded by a number of symbols that is insufficient for calculating the belonging criterion, the signal is preceded by a number of arbitrary values sufficient for this calculation. Thus, in the example illustrated, the signal is preceded by four values, arbitrarily chosen so as to be zero; these values make it possible to calculate the belonging criterion of the first four symbols S1-S4 to be encoded.

Advantageously, a file F is created containing the binary code C obtained by the encoding of the signal S. To enable decoding of the binary code C, all the information necessary for decoding is disposed in a header of the file, in particular, in the example illustrated:
the number of models;
the mean M;
the deviation DV;
the number of preceding elements to be used for calculating the moving average mm, in the form a power of two; and
the precision to be used for calculating the moving average, in the form of a power of two.

For decoding, the bounds of the models are recovered, simply by reading or recalculating, and then the belonging of a symbol Sn to be decoded to a model is determined in the same way as for encoding, from the symbols previously decoded without loss, and then the model found is used for decoding the symbol.

In the same way as on encoding, the first symbols to be decoded being preceded by a insufficient number of symbols for calculating the belonging criterion, the code corresponding to the encoded signal S is preceded by an arbitrary number of values sufficient for this calculation. These values are identical to those used for encoding. Thus, in the example illustrated, the code is preceded by four values, arbitrarily chosen so as to be zero; these values make it possible to calculate the belonging criterion of the first four symbols S1-S4 to be decoded.

The values of theoretical weights are calculated with the following hypotheses:

the weight of the models and other header information necessary for decoding the signal are ignored; and the binary encoder used is a perfect encoder encoding each symbol Sn according to its probability P(Sn) in $-\log_2(P(Sn))$ bits, P(Sn) being its probability according to the model provided.

For the theoretical calculation the following notations are used:

P(Sn): probability of the symbols, equal to the number of occurrences of this symbol divided by the number of symbols for this model;

N(Sn) the number of occurrences of the symbol Sn.

Thus each symbol encountered will in theory weigh $-\log_2(P(Sn))$, and all the symbols s in the context of a given model will therefore weigh:

$$-N(Sn) \times \log_2(P(Sn)).$$

In the case in question the symbols lie between −42 and 35, the theoretical weight of all the symbols in the context of the single model illustrated by the table Tab2 is:

$$p = \sum_{n=-42}^{35} -N(Sn) * \log 2(P(Sn))$$

With the above values, a weight of $P_{single\ model}=1941$ bits is obtained.

In the context of the separation into 5 models the same formula is used, calculating the probability with respect to the number of symbols of the current model. The following is then obtained:

Model 0: 300 bits;
Model 2: 92 bits;
Model 3: 505 bits;
Model 4: 588 bits;
Model 5: 34 bits.

The total weight is therefore the sum if the weights of the symbols encoded with each of these models, that is to say:

$$P_{5\ models}=300+92+505+588+34=1519\ bits.$$

According to these calculation hypotheses, 422 bits have been gained with respect to the single model. The greater the number of symbols to be encoded, the greater the predictable gain. Furthermore, the more different symbols there are in a signal, the more it may be advantage to increase the number of models used.

Naturally the invention is not limited to the examples that have just been described.

The invention claimed is:

1. An entropic binary coding method for a series (S) of symbols (Sn) using at least two models (m), each model being associated with a belonging criterion, said method comprising:

a first step of counting, for an entirety of said series (S), a total number of occurrences of each symbol to be coded using each one of said at least two models, said first step comprising:

i) initializing, for each one of said at least two models, and for each symbol, a count of a number of occurrences of each symbol to be coded by each model, and ii) running said series in order, for each symbol, to determine the encoding model (m) to which each symbol belongs, according to said belonging criteria, and incrementing the count of the number of occurrences of said symbol to be coded by said model; then a second step of calculating, for each model and for each symbol, a probability (P) of occurrence of the symbol in the model based on i) the total number of occurrences of the symbol to be coded by the model, and ii) the total number of occurrences of all symbols to be coded by the model; then a third step of encoding said series comprising running through said series, and encoding each symbol successively according to the model to which each symbol belongs using the probability of occurrence calculated in the second step; and a fourth step of storing the models or information enabling the models to be reconstituted and the binary code thus obtained.

2. The entropic binary coding method of claim 1, comprising a preliminary step of running through the series is first run through in order to determine the criteria of belonging to each of the models.

3. The entropic binary coding method of claim 2, wherein the belonging function is the mean (mm) of absolute values of a given number of reference symbols, immediately preceding said current symbol in the series.

4. The entropic binary coding of claim 3, wherein the criteria of belonging of a current symbol to one of the models is a lower bound l(m) of the range covered by the model and the comparison of the mean (mm) of the absolute values of the symbols preceding said current symbol.

5. The entropic binary coding method of claim 4, wherein, in order to determine the bound l(m):

the mean of the values of the symbols in the series is calculated; then the value of the difference between the maximum value and the mean on one hand and the mean and the minimum value on the other hand among the values of symbols in the series are calculated, and a distance (D) equal to the maximum from these two is deduced therefrom; then a deviation (DV) equal to the mean of the absolute values of the differences between each element of the signal and the mean of the series is calculated; then a spacing (E) is calculated using the formula:

$$\mathrm{Spacing} = \frac{\ln\left(\frac{\mathrm{Distance}}{\mathrm{Deviation}}\right)}{\ln(2)}$$

then the bound l(m) between the moving averages is calculated for each of the successive models (m) in accordance with the following formula:

$$l(m) = \mathrm{Distance} * \left(\frac{(m)}{\mathrm{number\ of\ models}}\right)^{\mathrm{spacing}}.$$

6. The entropic binary coding method of claim 2, wherein the belonging of a current symbol (Sn) to a model is determined using a belonging function mm(n) calculated from one or more symbols preceding said current symbol in the series.

7. The entropic binary coding of claim 3, wherein said given number of reference symbol is 4.

8. The entropic binary coding method of claim 1, wherein the belonging of a current symbol (Sn) to a model is determined using a belonging function mm(n) calculated from one or more symbols preceding said current symbol in the series.

9. The entropic binary coding method of claim 8, wherein the belonging function is the mean (mm) of absolute values of a given number of reference symbols, immediately preceding said current symbol in the series.

10. The entropic binary coding method of claim 1, wherein each symbol is a number.

11. The entropic binary coding method of claim 10, wherein, for calculating the belonging function, the list is preceded by a predefined number of arbitrary signals.

12. The entropic binary coding method of claim 11, wherein the criteria of belonging of a current symbol to one of the models is a lower bound l(m) of the range covered by the model and the comparison of the mean (mm) of the absolute values of the symbols preceding said current symbol.

13. The entropic binary coding of claim 11, wherein the value of each arbitrary signal is zero.

14. A compression method for compressing a medium of the image, video or sound type, which comprises using the entropic binary encoding method of claim 10.

15. The compression method of claim 14, which is applied to compressed symbols of said image, each corresponding to a box of a matrix, the sequence being formed by putting said symbols in a line.

16. The compression method of claim 15, wherein, for putting the symbols in a line, for each row the row is run through in a first direction and then the following row, in the opposite direction to the first.

17. The entropic binary coding of claim 10, wherein each symbol is a number in base 10.

18. An entropic binary decoding method for a series of symbols using at least two models and encoded by means of a method of claim 1, further comprising:
- a fifth step of extracting each of the models used on encoding;
- a sixth step of extracting or recalculating the criteria for belonging to each of these models extracted in the fifth step, and
- a seventh step of decoding each symbol comprising determining, for each symbol, the model used on encoding using the same belonging criteria used as on encoding.

19. An entropic binary coding method for a series (S) of symbols (Sn) using at least two models (m), each model being associated with a belonging criterion, comprising steps during which:
- said series is run through in order, for each symbol, to determine the encoding model (m) to which each symbol of said series belongs, according to said belonging criteria; then
- for each model and for each symbol, a probability (P) of occurrence of the symbol in the model is determined; then
- said series is run through once again by encoding each symbol successively according to the model to which each symbol belongs; and
- the models or information enabling them to be reconstituted and the binary code thus obtained are stored,
wherein the belonging of a current symbol (Sn) to a model is determined using a belonging function mm(n) calculated from one or more symbols preceding said current symbol in the series, wherein,
the belonging function is the mean (mm) of absolute values of a given number of reference symbols, immediately preceding said current symbol in the series,
the criteria of belonging of a current symbol to one of the models is a lower bound l(m) of the range covered by the model and the comparison of the mean (mm) of the absolute values of the symbols preceding said current symbol, and
the bounds of each of the models is stored in an increasing order, the difference between two successive bounds increases when the value of said bounds increases.

20. An entropic binary coding method for a series (S) of symbols (Sn) using at least two models (m), each model being associated with a belonging criterion, comprising steps during which:
- said series is run through in order, for each symbol, to determine the encoding model (m) to which each symbol of said series belongs, according to said belonging criteria; then
- for each model and for each symbol, a probability (P) of occurrence of the symbol in the model is determined; then
- said series is run through once again by encoding each symbol successively according to the model to which each symbol belongs; and
- the models or information enabling them to be reconstituted and the binary code thus obtained are stored,
wherein the belonging of a current symbol (Sn) to a model is determined using a belonging function mm(n) calculated from one or more symbols preceding said current symbol in the series, and
wherein the belonging function is the mean (mm) of absolute values of four reference symbols, immediately preceding said current symbol in the series.

* * * * *